(12) United States Patent
Mardilovich et al.

(10) Patent No.: US 7,381,658 B2
(45) Date of Patent: Jun. 3, 2008

(54) ENCAPSULATION OF NANO-DIMENSIONAL STRUCTURES BY OXIDATION

(75) Inventors: Peter Mardilovich, Corvallis, OR (US); Pavel Komilovich, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 176 days.

(21) Appl. No.: 11/174,896

(22) Filed: Jul. 5, 2005

(65) Prior Publication Data

US 2007/0007518 A1    Jan. 11, 2007

(51) Int. Cl.
*H01L 21/31*     (2006.01)
*H01L 21/469*    (2006.01)

(52) U.S. Cl. .................. 438/770; 438/758; 438/785

(58) Field of Classification Search ........ 438/758–774, 438/785

See application file for complete search history.

(56) References Cited

U.S. PATENT DOCUMENTS

| | | |
|---|---|---|
| 5,126,283 A | 6/1992 | Pintchovski et al. |
| 5,244,828 A | 9/1993 | Okada et al. |
| 6,069,070 A | 5/2000 | Labunov et al. |
| 6,090,666 A | 7/2000 | Ueda et al. |
| 6,211,531 B1 | 4/2001 | Nakazato et al. |
| 6,319,727 B1 | 11/2001 | Vlassak |
| 2005/0072967 A1 | 4/2005 | Komilovich et al. |

OTHER PUBLICATIONS

Transmittal of the International Search Report and the Written Opinion of the International Searching Authority dated Dec. 6, 2006.

*Primary Examiner*—Cuong Q Nguyen

(57) ABSTRACT

This invention relates to a method of encapsulating nano-dimensional structures, comprising: depositing at least one material upon a substrate such that the material includes at least one portion; and creating an oxidized layer located substantially adjacent to the deposited material such that the at least one portion of the deposited material becomes substantially encapsulated by a portion of the oxidized layer.

24 Claims, 10 Drawing Sheets

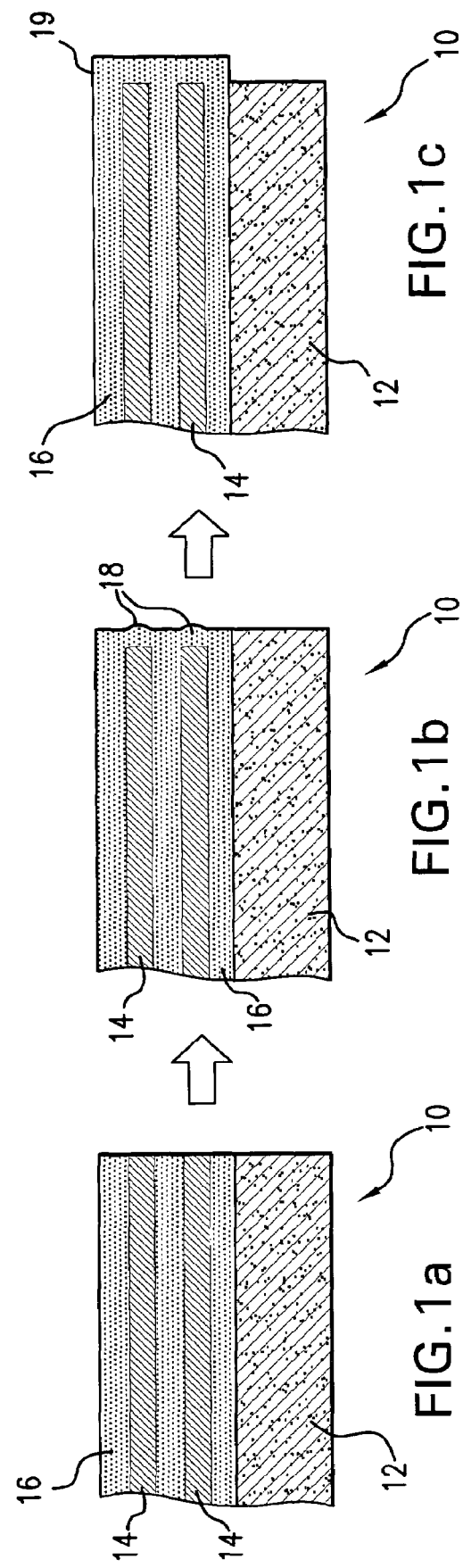

Electrochemical oxidation (anodization)

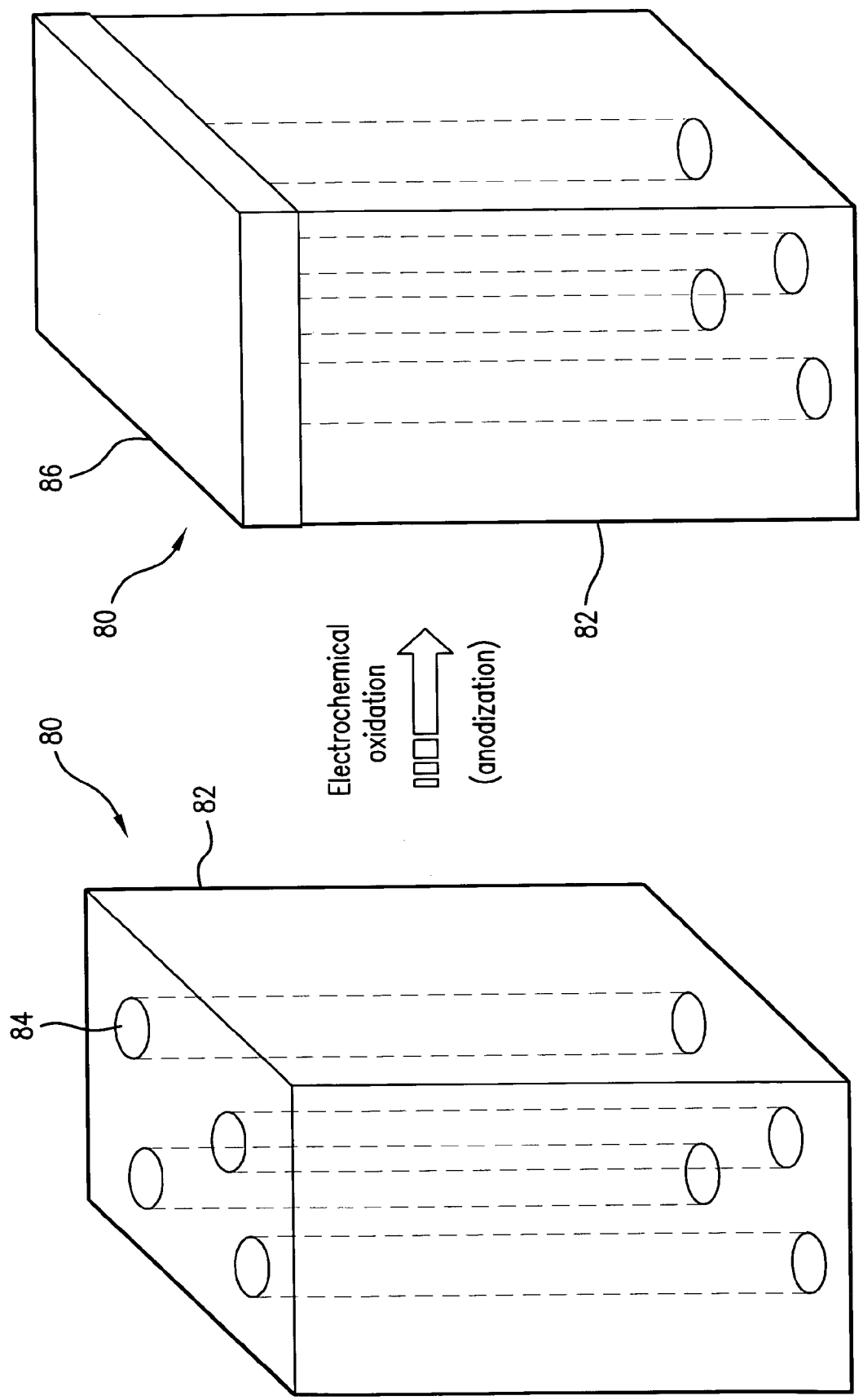

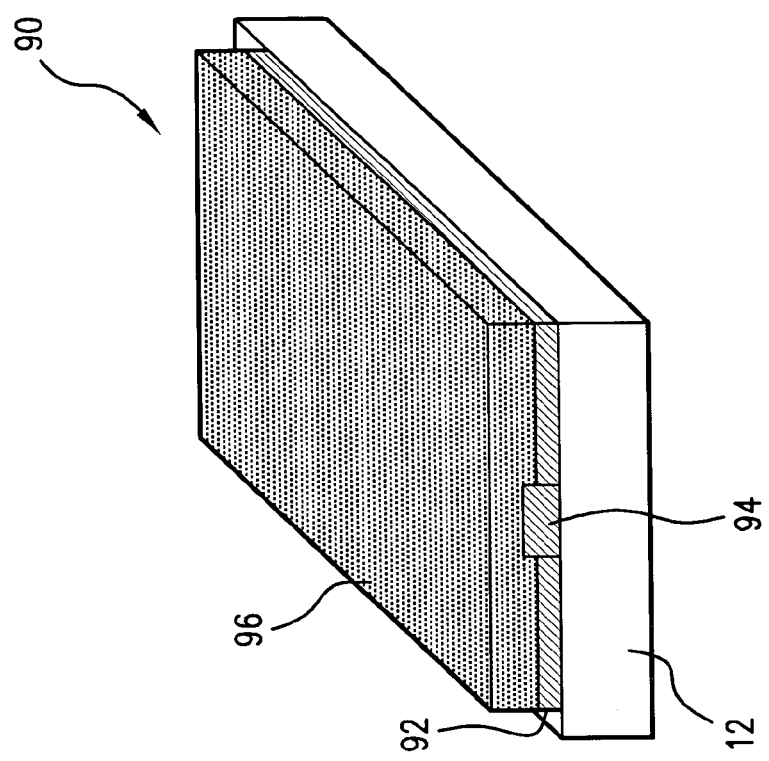
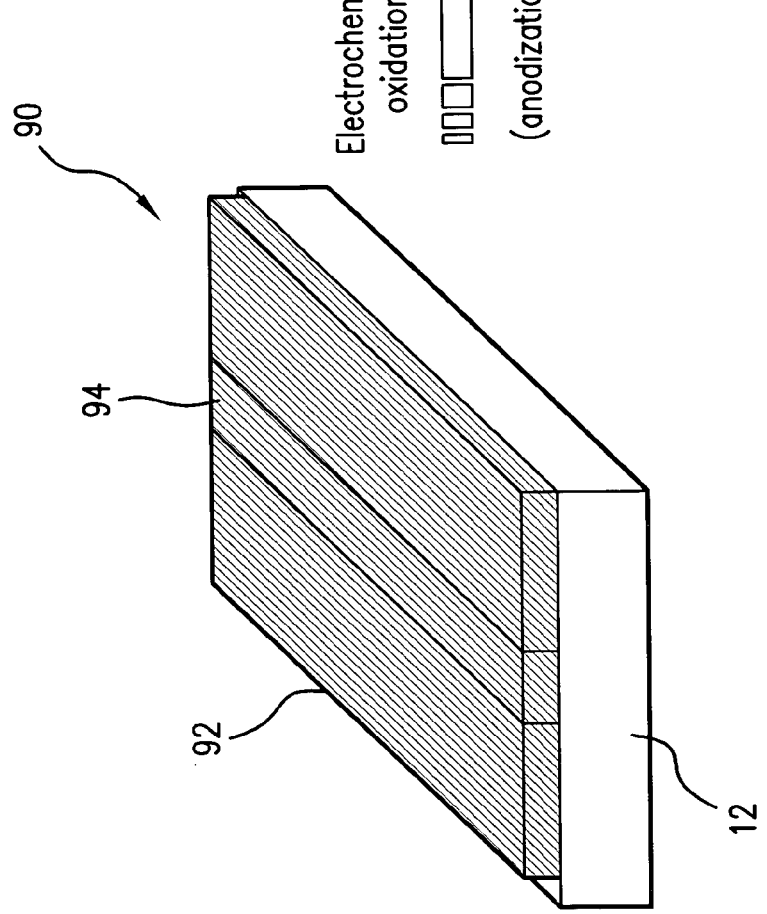
FIG.9b
FIG.9a

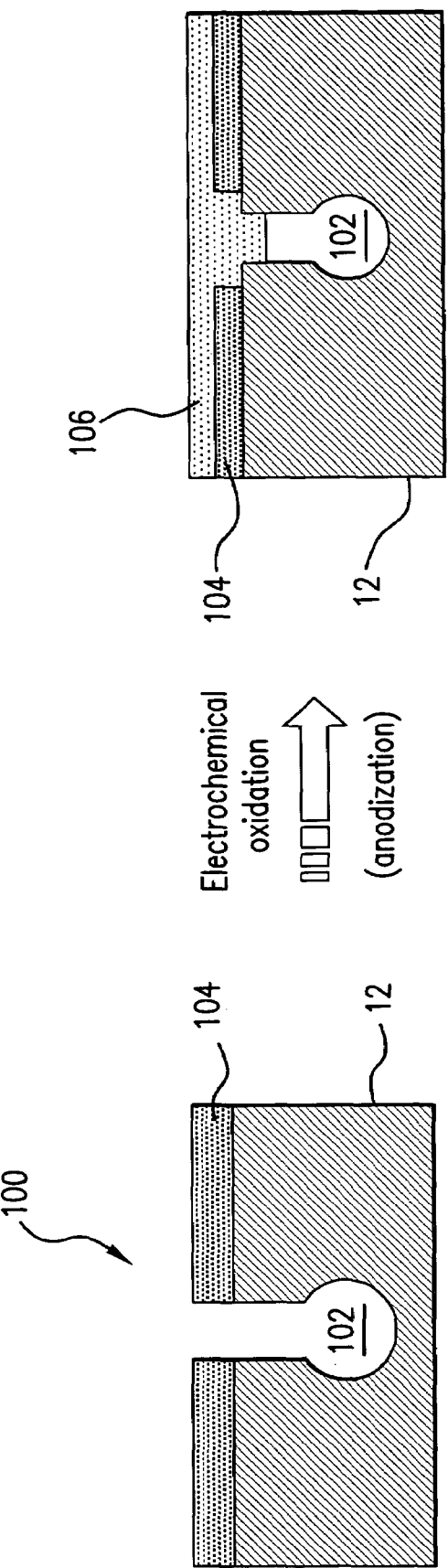

ENCAPSULATION OF NANO-DIMENSIONAL STRUCTURES BY OXIDATION

BACKGROUND OF THE INVENTION

1. Field of the Invention

This invention relates to a method of encapsulating nano-dimensional structures, comprising: depositing at least one material upon a substrate such that the material includes at least one portion; and creating an oxidized layer located substantially adjacent to the deposited material such that the at least one portion of the deposited material becomes substantially encapsulated by a portion of the oxidized layer.

2. Description of the Related Art

Prior to the present invention, as set forth in general terms above and more specifically below, it is known, that industrial interest in materials having structural and functional features with nanoscale dimensions has been growing rapidly. Nano-structures have been fabricated by semiconductor processing techniques including patterning techniques such as photolithography, electron-beam lithography, ion-beam lithography, X-ray lithography, and the like. Other nano-structures have also been fabricated utilizing structures formed by self-ordering processes.

It is further known that such small objects require novel and specialized methods of fabrication and subsequent processing. One common task is localized encapsulation of conductors or sensing surfaces. With increasing complexity of nanostructures, it will be more and more difficult to insulate certain regions of the device, while leaving others intact or exposed to the environment. At present, the most common and direct approach to encapsulation is to mask the relevant part of the device and cover it with a protective (insulating) layer. However, this general approach is difficult to implement when coverage of the device areas adjacent to the area being insulated is undesirable because it may interfere with the device's operation. In such cases, very precise masking processes (alignment, deposition, etc.) are required, which would be difficult to achieve at the nanoscale level.

As an example, consider the edge of a 100 nm stack of 10 nm thick layers alternating between conducting and insulating layers. Such an edge would be very difficult, if not impossible, to insulate using the traditional mask and deposit approach, without depositing material on the top face of the structure, which may be undesirable. Such a situation requires a localized means of encapsulation and protection of the conductive edges of the conductive layers. Consequently, a more advantageous nanostructure encapsulation system, then, would be provided if inexpensive and accurate methods of encapsulation could be developed.

It is apparent from the above that there exists a need in the art for an encapsulation system that is inexpensive, effective, and capable of localized encapsulation of the conductors or sensing surfaces. It is a purpose of this invention to fulfill this and other needs in the art in a manner more apparent to the skilled artisan once given the following disclosure.

SUMMARY OF THE INVENTION

Generally speaking, an embodiment of this invention fulfills these needs by providing a method of encapsulating nano-dimensional structures, comprising: depositing at least one material upon a substrate such that the material includes at least one portion; and creating an oxidized layer located substantially adjacent to the deposited material such that the at least one portion of the deposited material becomes substantially encapsulated by a portion of the oxidized layer.

In certain preferred embodiments, the material layer can be an anodizable or non-anodizable material. Also, the oxidizing of the layer can create an oxide that is the oxide of the deposited material or is a metal oxide of a different material. Finally, the oxidation step can be accomplished through electrochemical oxidation (anodization) or thermal oxidation.

In another further preferred embodiment, the method creates an inexpensive, effective, and localized encapsulation of portions of the material.

The preferred method of encapsulation of nano-dimensional structures by oxidization, according to various embodiments of the present invention, offers the following advantages: ease-of-use; increased economy; and improved encapsulation. In fact, in many of the preferred embodiments, these factors of ease-of-use, increased economy, and improved encapsulation are optimized to an extent that is considerably higher than heretofore achieved in prior, known nano-dimensional structure encapsulation methods.

The above and other features of the present invention, which will become more apparent as the description proceeds, are best understood by considering the following detailed description in conjunction with the accompanying drawings, wherein like characters represent like parts throughout the several views and in which:

BRIEF DESCRIPTION OF THE DRAWINGS

FIGS. 1a-1c illustrate a method of encapsulation of nano-dimensional structures by oxidation, according to one embodiment of the present invention;

FIGS. 8a and 8b are schematic illustrations of encapsulation of ends of one-dimensional objects, according to another embodiment of the present invention;

FIGS. 9a and 9b are schematic illustrations of encapsulation of one-dimensional objects, according to another embodiment of the present invention; and FIGS. 10a and 10b are schematic illustrations of encapsulation of enclosures, according to another embodiment of the present invention.

DETAILED DESCRIPTION OF THE INVENTION

Figure 2A:
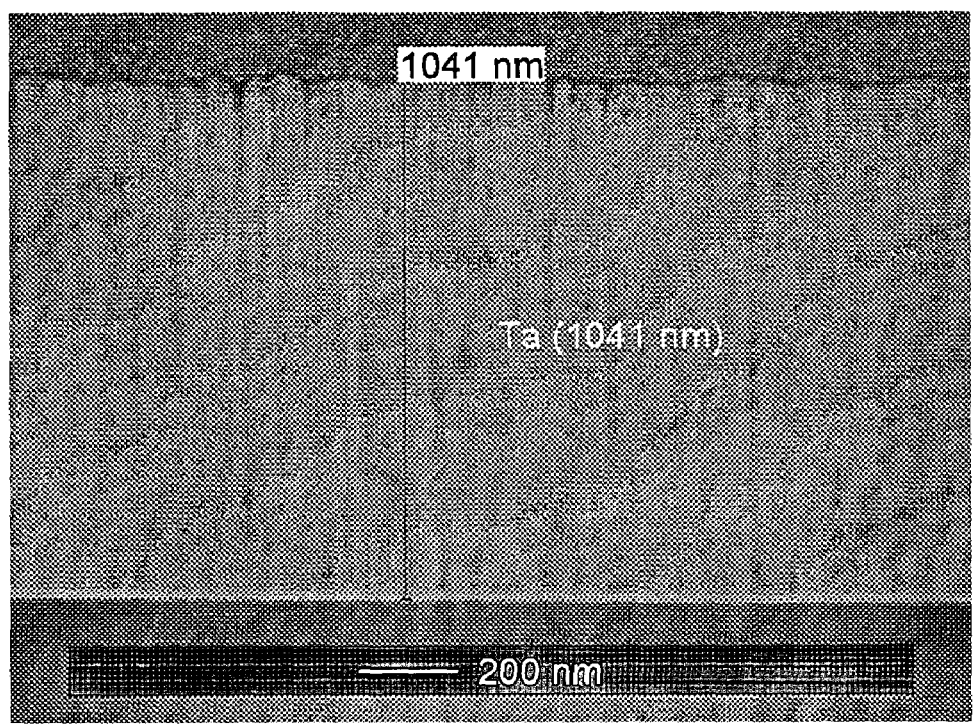
FIG. 2 illustrates the expansion effect of tantalum pentoxide, according to one embodiment of the present invention.

For clarity of the description, the drawings are not drawn to a uniform scale. In particular, vertical and horizontal scales may differ from each other and may vary from one drawing to another. In this regard, directional terminology, such as "top," "bottom," "front," "back," "leading," "trailing," etc., is used with reference to the orientation of the drawing figure(s) being described. Because components of the invention can be positioned in a number of different orientations, the directional terminology is used for purposes of illustration and is in no way limiting.

The term "oxidation" is used in this specification and the appended claims to mean electrochemical oxidization (anodization) or thermal oxidation of an oxidizable material (such as an oxidizable metal). "Anodization" is performed by employing the oxidizable material as an anode in an electrolytic cell and by operating the electrolytic cell with voltage and current suitable to partially or fully oxidize the material of the anode. An "anodic oxide" is the oxide thus formed. Thermal oxidization refers to where the oxide is formed by exposing the material to a combination of heat and an oxidizing ambient condition (e.g., oxygen, water vapor, etc). An "anodizable material" is a material that can be oxidized in these manners. "Partial anodization" refers to oxidation of less than the entire thickness of a metal layer; i.e., some thickness of unoxidized metal remains after partial anodization, unless full anodization is explicitly specified. "Full anodization" refers to oxidation of the entire thickness of a metal layer. References herein to a layer of electrochemically oxidizable metal are intended to include semiconductor materials such as silicon which, with respect to their anodization, behave like the electrochemically oxidizable metals.

An embodiment of a layered structure may be made by providing a substrate, depositing a quantity of electrochemically or thermally oxidizable material such as a metal over the substrate, oxidizing the electrochemically or thermally oxidizable material (partially or fully), and repeating similar steps until a layered structure having a desired total structure thickness is completed. The thickness of each layer of the layered structure may be nanoscopic. Thus, another aspect of the invention provides methods for fabricating embodiments of layered structures, including structures whose layers have nanoscale dimensions.

One embodiment of a method for fabricating a layered structure employs the steps of providing a substrate, depositing a quantity of an electrochemically or thermally oxidizable material over the substrate to form an electrochemically or thermally oxidizable layer, oxidizing the electrochemically or thermally oxidizable material until a layer of oxide is formed, and repeating alternately the depositing and oxidizing steps until a layered structure having a desired total thickness is completed. The structure may be one of the types known as a superlattice. The electrochemically or thermally oxidizable material is oxidized until a layer of oxide having a desired thickness is formed. In some cases, that oxidation may be a partial oxidation, i.e., less than the entire thickness of the oxidizable material is oxidized.

Many electrochemically oxidizable materials are known, including the metals aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), vanadium (V), gold (Au), chromium (Cr), cobalt (Co), iridium (Ir), rhenium (Re), and uranium (U), along with their electrochemically/thermally oxidizable alloys, mixtures, and combinations, all of which are suitable for use in this method. Another suitable material is silicon (Si), although it is not classified as a metal, but as a semiconductor. In short, what is desired in the present invention is that a dense amorphous film be formed during the oxidation process such that the oxidized material is expandable. Thus, references herein to a layer of electrochemically/thermally oxidizable material or metal are intended to include semiconductor materials such as silicon which, with respect to their oxidation, behave like the electrochemically or thermally oxidizable metals. To simplify the description and drawings, embodiments using metals for a electrochemically or thermally oxidizable material will be described. Those skilled in the art will understand that any electrochemically or thermally oxidizable material may be substituted wherever "metal" is mentioned, except where the metal is explicitly described as not being electrochemically or thermally oxidizable.

The thickness of dense oxide films (with densities comparable to theoretical oxide densities) formed by electrochemical or thermal oxidation of oxidizable material is precisely controllable by controlling the anodization voltage, as described in more detail hereinbelow.

Returning now to the description of a method embodiment for fabricating a layered structure, the layer of electrochemically or thermally oxidizable metal (or, in the case of silicon, for example, electrochemically oxidizable semiconductor) may be deposited by any suitable conventional deposition method, such as evaporation, sputtering, plating, electroplating, atomic layer deposition (ALD), or chemical vapor deposition (CVD). The metal layer may have a thickness of about two nanometers (2 nm) or greater, for example, with essentially no theoretical upper limit, but limited only by practical considerations such as deposition conditions, application requirements, etc.

Figure 2B:
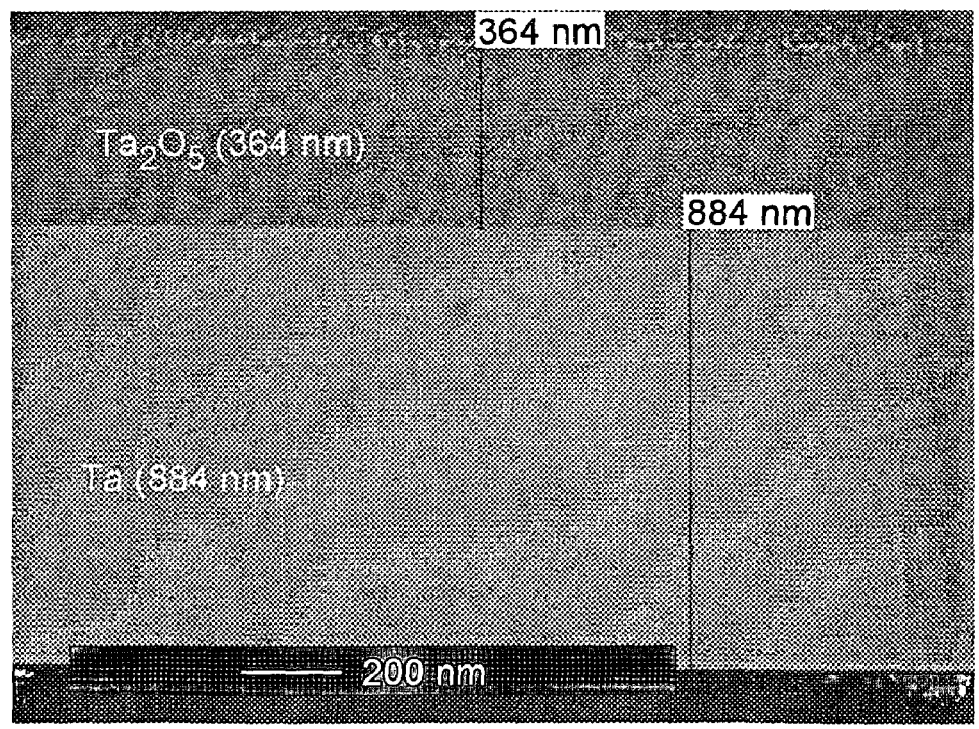

With reference first to FIG. 1, there is illustrated one preferred embodiment for use of the concepts of this invention. As shown in FIG. 1a, a schematic illustration of a nano-dimensional structure 10 is presented. A suitable substrate 12 is provided. For many applications, substrate 12 is a smooth planar silicon wafer as is commonly used in semiconductor manufacturing. For some applications, a layer of insulating material such as silicon oxide or silicon nitride may be formed on the silicon wafer so the top surface of the substrate is an insulator. It is to be understood that the substrate can also be constructed of glass; quartz; alumina; stainless steel; along with its oxides, nitrides; various plastics; mixtures, and combinations thereof. See, for example, commonly assigned, pending U.S. patent application Ser. Nos. 10/062,050, filed Jan. 31, 2005, entitled "Periodic Layered Structures and Methods Therefore" and Ser. No. 11/174,798, filed Jul. 5, 2005, entitled "Encapsulation Of Multilayer Edges By Anodization", which are to be incorporated by reference in their entirety. Oxide layer 16 is deposited upon substrate 12. A layer 14 of a first metal is then conventionally deposited upon oxide layer 16. In this embodiment, the first metal is an electrochemically oxidizable material. When the metal layer 14 is partially oxidized to create an oxide layer 16, the total thickness typically increases. The volume ratio of oxide to consumed metal is typically greater than one. For example, partial oxidation of a 1041 nanometer film of tantalum results in a tantalum oxide film having a thickness of 364 nanometers and an overall thickness of 1,248 nanometers. (See, for example, FIG. 2). Another layer 14 of the first metal is deposited upon oxide layer 16 and further partially oxidized to create another oxide layer 16. The process of depositing the metal layer 14 and partially oxidizing it to create oxide layer 16 is performed until the desired layering effect is achieved.

After nano-dimensional structure 10 has been constructed, one or more metal layers 14 are further partially oxidized, as shown in FIG. 1b. This further partial oxidization causes the oxide layer 16 to expand around metal layer 14. As a by-product of this expansion, nodes 18 in the oxide layer 16 are formed that also extend from the exposed portion of metal layer 14. This further expansion of the oxide layer 16 provides a complete encapsulation 19 around a portion of the entire structure 10, as shown in FIG. 1c.

As discussed earlier, FIG. 2 shows the expansion effect of tantalum pentoxide ($Ta_2O_5$) as the result of the process of electrochemical oxidation of tantalum (Ta). The expansion coefficient is defined as the ratio of $Ta_2O_5$ volume to consumed Ta volume. In this embodiment, the expansion coefficient is approximately 2.3 for oxidation of Ta.

Figure 3A:
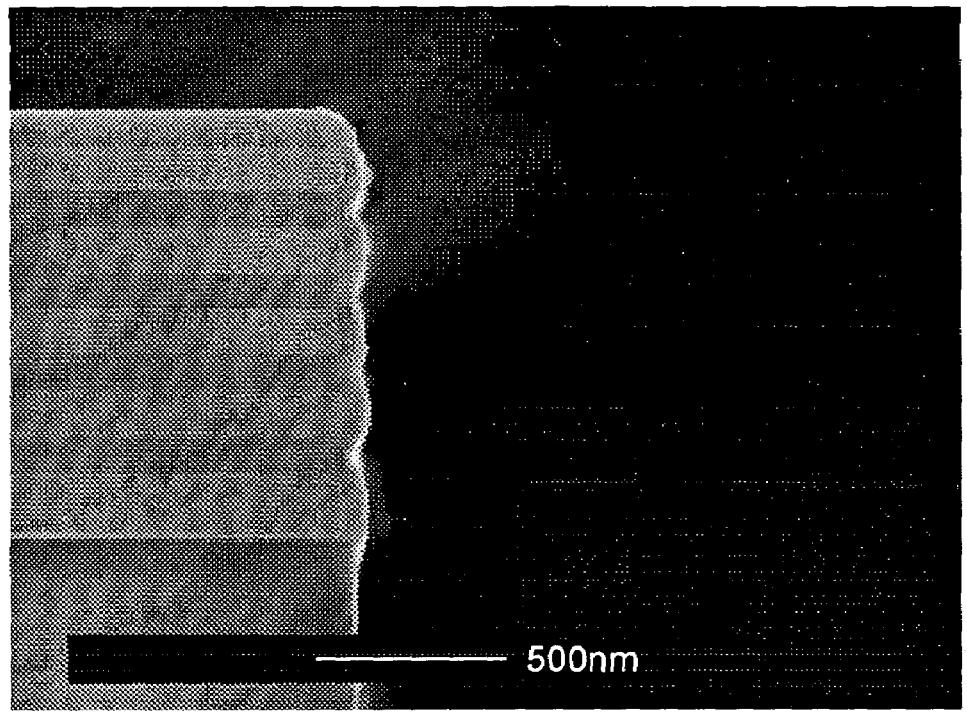
FIGS. 3a and 3b illustrate a tantalum/tantalum pentoxide stack oxidized from the edge, according to another embodiment of the present invention.
Figure 3B:
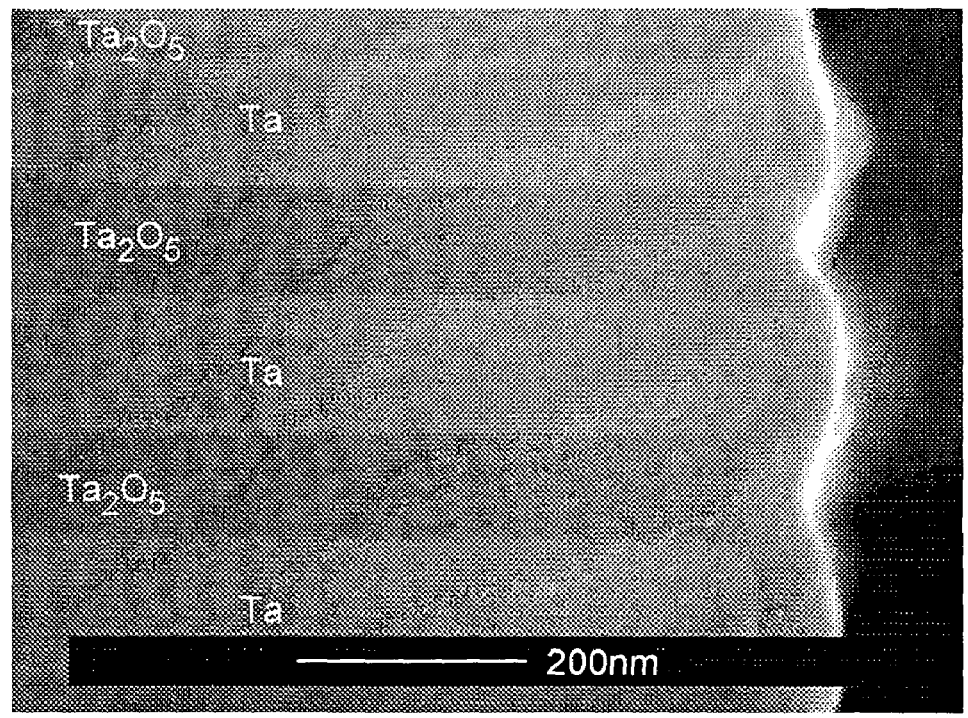

With respect to FIGS. 3a and 3b, encapsulation of 100 nm tantalum (Ta) layers is presented. Scanning electron microscope (SEM) images of a Ta/$Ta_2O_5$ stack partially oxidized from the edge to an oxide thickness of approximately 50 nm is shown. It must be pointed out that the external oxide profile substantially conforms to the profile of the Ta layers. This relatively small oxidation thickness corresponds to FIG. 1b.

Figure 4A:
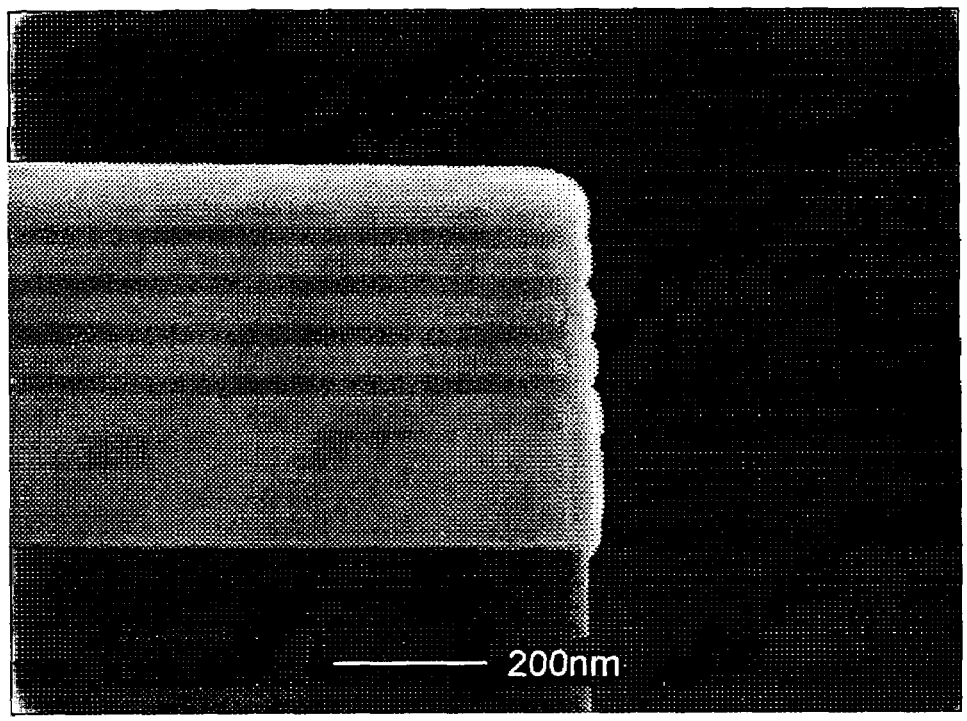
FIGS. 4a and 4b illustrate another tantalum/tantalum pentoxide stack oxidized from the edge, according to another embodiment of the present invention.
Figure 4B:
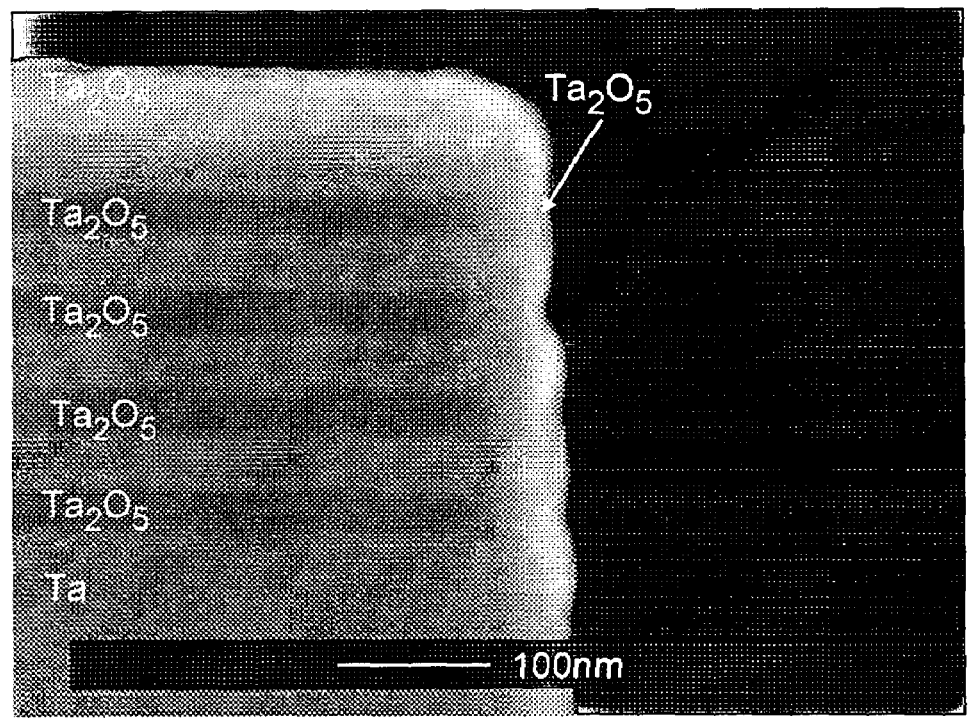

With respect to FIGS. 4a and 4b, encapsulation of 30 nm tantalum (Ta) layers is presented. SEM images of a Ta/$Ta_2O_5$ stack partially oxidized from the edge to a specific thickness of approximately 30 nm of $Ta_2O_5$ are shown. As further partial oxidization of the Ta layers is completed, the external oxide profile begins to conform less and less to the profile of the Ta layers.

Figure 5A:
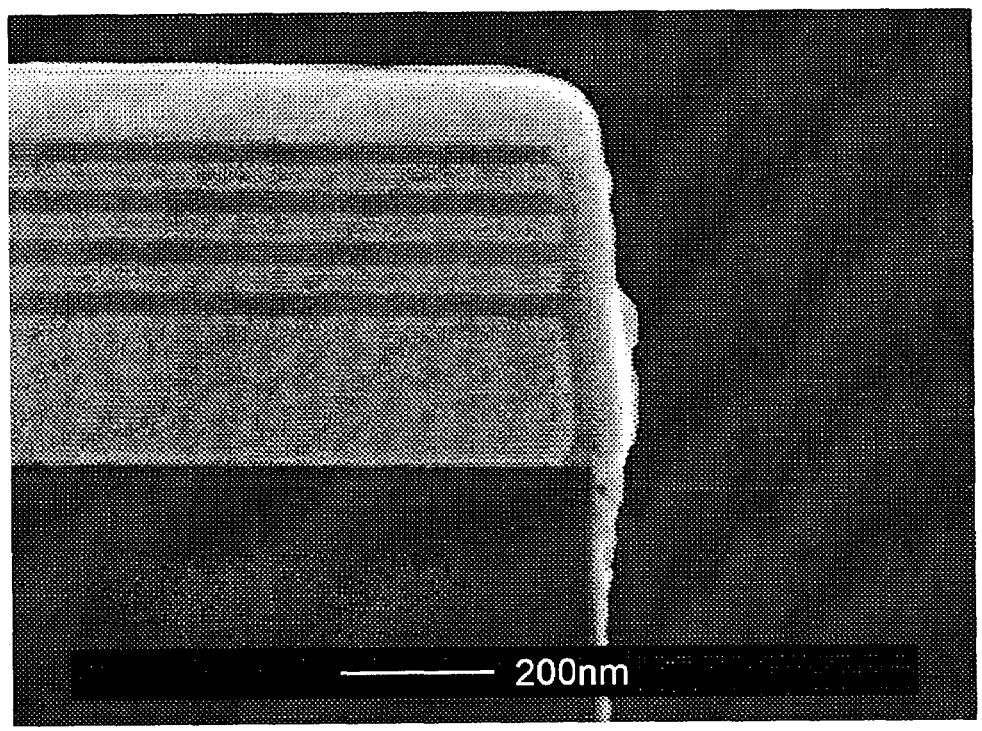
FIGS. 5a and 5b illustrate still another tantalum/tantalum pentoxide stack oxidized from the edge, according to another embodiment of the present invention.
Figure 5B:
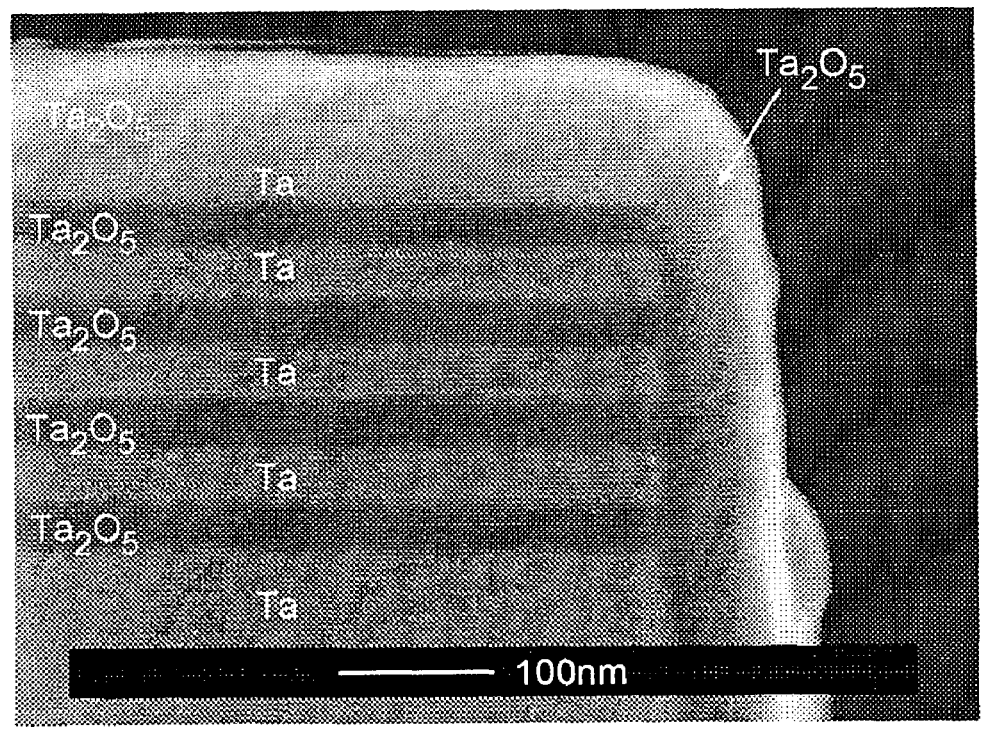

With respect to FIGS. 5a and 5b, further partial oxidization (60 nm thickness of $Ta_2O_5$) of the Ta layers results in a continuous, dense, smooth, expandable oxidation layer without evidence of the underlying metal layer structure. At this point, effective encapsulation of the underlying nano-dimensional structure has been achieved.

Figure 6A:
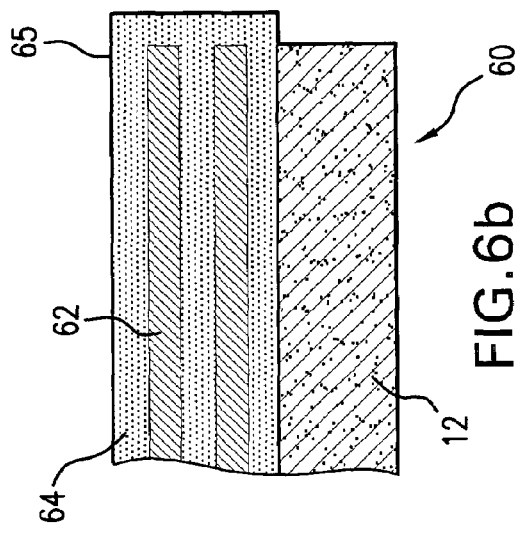
FIGS. 6a-6d are schematic illustrations of oxidation of a metal, according to another embodiment of the present invention.
Figure 6B:
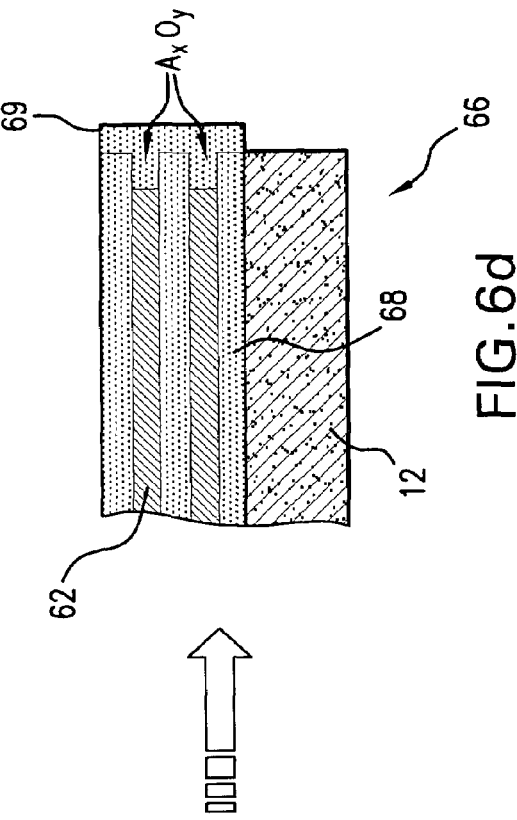

With respect to FIGS. 6a-6d, nano-dimensional structure 60 is illustrated. In FIGS. 6a and 6b, oxide layer 64 is deposited upon substrate 12. Metal layers 62 are then partially oxidized to create oxide layers 64, 68 in a similar fashion, as discussed above. As can be seen in FIG. 6b, encapsulation layer 65 provides a complete encapsulation around metal layers 62. In FIGS. 6a and 6b, oxide layers 64 are metal oxides of metal layers 62.

Figure 6C:
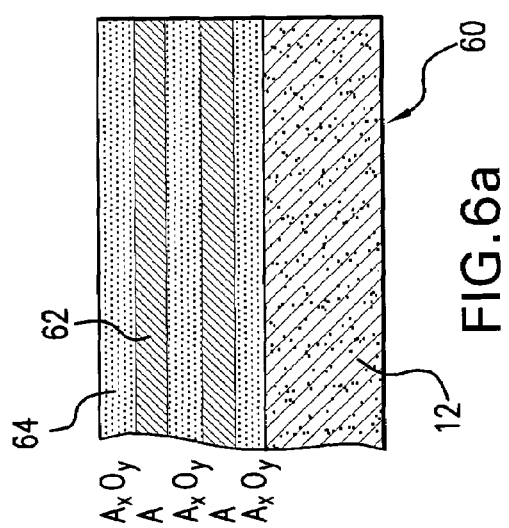
Figure 6D:
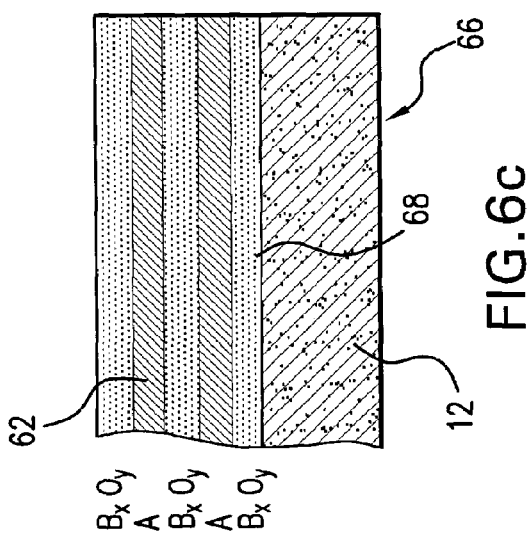

With respect to FIGS. 6c and 6d, oxide layers 68 are formed by directly depositing the appropriate material 68, or perhaps by depositing a 2-layer metal stack and then oxidizing only the "top" sub-layer of metal corresponding to the oxide type 68, leaving the remaining metal layer 62 unoxidized. As can be seen in these figures, a metal oxide is formed from a metal that is different than the metal in layer 62. As can be further seen in FIG. 6d, oxide layer 69 provides a complete encapsulation around metal layers 62 and material layers 68.

Figure 7B:
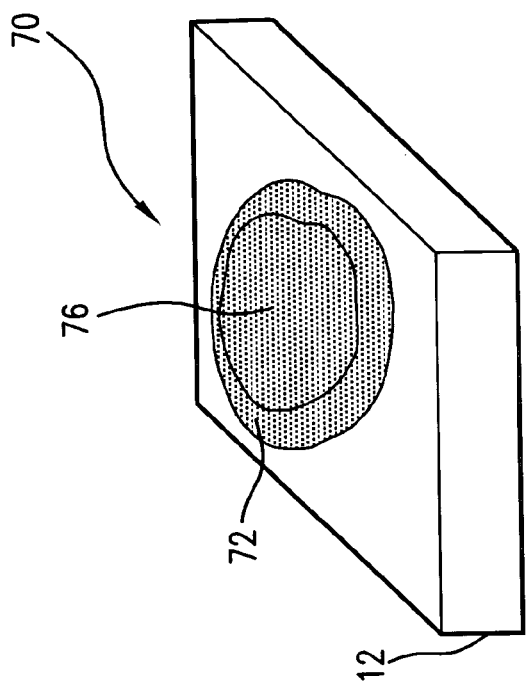
FIGS. 7a and 7b are schematic illustrations of encapsulation of zero-dimensional objects, according to another embodiment of the present invention.
Figure 7A:
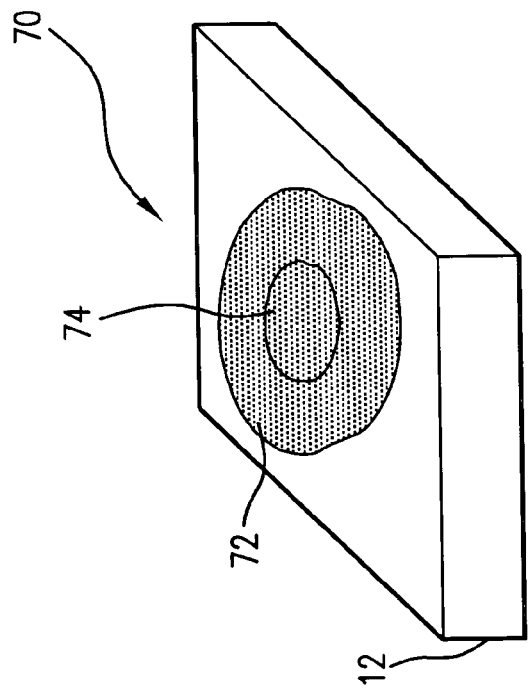

With respect to FIGS. 7a and 7b, a zero-dimensional object or dot 74 is surrounded by layer 72. Layer 72 is partially oxidized to create encapsulation layer 76. As can be seen, layer 76 completely encapsulates dot 74.

With respect to FIGS. 8a and 8b, the ends of a one-dimensional object 84 are surrounded by layer 82. In these figures, the one-dimensional object 84 is the end of a column of a material to be encapsulated. Layer 82 is partially oxidized to create encapsulation layer 86. As can be seen, layer 76 completely encapsulates one-dimensional object 84. It is to be understood that FIGS. 8a and 8b can be used to illustrate the encapsulation of edge of a two-dimensional object or layer.

With respect to FIGS. 9a and 9b, a one-dimensional 94 is located between layers 92. Layers 92 are partially oxidized to create encapsulation layer 96. As can be seen, layer 76 completely encapsulates one-dimensional object 94.

With respect to FIGS. 10a and 10b, an enclosure 102 is located adjacent to layer 104 and substantially within substrate 12. Layer 104 is partially oxidized to create encapsulation layer 106. As can be seen, layer 106 completely encapsulates enclosure 102.

Also, the present invention can be embodied in any computer-readable medium for use by or in connection with an instruction-execution system, apparatus or device such as a computer/processor based system, processor-containing system or other system that can fetch the instructions from the instruction-execution system, apparatus or device, and execute the instructions contained therein. In the context of this disclosure, a "computer-readable medium" can be any means that can store, communicate, propagate or transport a program for use by or in connection with the instruction-execution system, apparatus or device. The computer-readable medium can comprise any one of many physical media such as, for example, electronic, magnetic, optical, electromagnetic, infrared, or semiconductor media. More specific examples of a suitable computer-readable medium would include, but are not limited to, a portable magnetic computer diskette such as floppy diskettes or hard drives, a random access memory (RAM), a read-only memory (ROM), an erasable programmable read-only memory, or a portable compact disc. It is to be understood that the computer-readable medium could even be paper or another suitable medium upon which the program is printed, as the program can be electronically captured, via, for instance, optical scanning of the paper or other medium, then compiled, interpreted or otherwise processed in a single manner, if necessary, and then stored in a computer memory.

Those skilled in the art will understand that various embodiment of the present invention can be implemented in hardware, software, firmware or combinations thereof. Separate embodiments of the present invention can be implemented using a combination of hardware and software or firmware that is stored in memory and executed by a suitable instruction-execution system. If implemented solely in hardware, as in an alternative embodiment, the present invention can be separately implemented with any or a combination of technologies which are well known in the art (for example, discrete-logic circuits, application-specific integrated circuits (ASICs), programmable-gate arrays (PGAs), field-programmable gate arrays (FPGAs), and/or other later developed technologies. In preferred embodiments, the present invention can be implemented in a combination of software and data executed and stored under the control of a computing device.

It will be well understood by one having ordinary skill in the art, after having become familiar with the teachings of the present invention, that software applications may be written in a number of programming languages now known or later developed.

Once given the above disclosure, many other features, modifications or improvements will become apparent to the skilled artisan. Such features, modifications or improvements are, therefore, considered to be a part of this invention, the scope of which is to be determined by the following claims.

What is claimed is:

1. A method of forming and encapsulating nano-dimensional structures, comprising:

depositing a layer of material upon a substrate;
creating an oxidized layer over said layer of material;
repeating said depositing of a layer of material and said creating an oxidized layer over the deposited layer to form a multi-layer structure; and
forming an additional oxidized layer on said multi-layer structure such that said multi-layer structure becomes substantially encapsulated by said additional oxidized layer.

2. The method, as in claim 1, wherein the material comprises a material selected from the list consisting of aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), vanadium (V), gold (Au), cobalt (Co), iridium (Ir), rhenium (Re), uranium (U), and chromium (Cr), along with their oxidizable alloys, mixtures, and combinations thereof.

3. The method, as in claim 1, wherein the substrate comprises a material selected from the list consisting of: glass; quartz; alumina; stainless steel; silicon, along with its oxides, nitrides; various plastics; mixtures, and combinations thereof.

4. The method, as in claim 1, wherein the oxidized layer comprises oxides of the material selected from the list consisting of: aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), vanadium (V), gold (Au), cobalt (Co), iridium (Ir), rhenium (Re), uranium (U), and chromium (Cr).

5. The method, as in claim 1, wherein the oxidized layer is created by electrochemical oxidation.

6. The method, as in claim 1, wherein the oxidized layer is created by thermal oxidation.

7. The method of claim 1, wherein depositing a layer of material comprises depositing a layer of oxidizable material and said creating an oxidized layer over said layer of material comprises partially oxidizing said layer of material.

8. The method of claim 7, wherein said layer of material comprises a metal.

9. The method of claim 7, wherein said layer of material comprises a semiconductor material.

10. The method of claim 9, wherein said layer of material comprises silicon.

11. The method of claim 1, wherein depositing a layer of material comprises depositing a layer of oxidizable material and said forming an additional oxidized layer comprises oxidizing exposed edges of said layer or layers of material to substantially encapsulated said multi-layer structure.

12. The method of claim 1, further comprising depositing an oxide layer on aid substrate prior to depositing said layer.

13. The method of claim 1, wherein depositing a layer of material comprises depositing a first layer of material followed by a second layer of a different material, said second layer of material being oxidizable, and wherein creating an oxidized layer comprises at least partially oxidizing said second layer.

14. A system for encapsulating nano-dimensional structures, comprising:
means for forming a nano-dimensional structure;
means for depositing at least one oxidizable material at said nano-dimensional structure; and
means for at least partially oxidizing said material to form an oxidized layer such that said nano-dimensional structure becomes at least partially encapsulated by a portion of the oxidized layer.

15. The system, as in claim 14, wherein the material comprises a material selected from the list consisting of: aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), gold (Au), cobalt (Co), chromium (Cr), iridium (Ir), rhenium (Re), uranium (U), and vanadium (V), along with their oxidizable alloys, mixtures, and combinations thereof.

16. The system, as in claim 14, wherein the substrate comprises a material selected from the list consisting of: glass; quartz; alumina; stainless steel; silicon, along with its oxides, nitrides; various plastics; mixtures, and combinations thereof.

17. The system, as in claim 14, wherein the oxidized layer comprises oxides of the material selected from the list consisting of: aluminum (Al), tantalum (Ta), niobium (Nb), tungsten (W), bismuth (Bi), antimony (Sb), silver (Ag), cadmium (Cd), iron (Fe), magnesium (Mg), tin (Sn), zinc (Zn), titanium (Ti), copper (Cu), molybdenum (Mo), hafnium (Hf), zirconium (Zr), titanium (Ti), gold (Au), cobalt (Co), chromium (Cr), iridium (Ir), rhenium (Re), uranium (U), and vanadium (V).

18. The system, as in claim 14, wherein the oxidized layer is created by an electrochemical oxidation means.

19. The system, as in claim 14, wherein the oxidized layer is created by a thermal oxidation means.

20. The system of claim 14, wherein said nano-dimensional structure comprises a multi-layer structure of alternating metal and oxidized layers.

21. The system of claim 20, wherein said metal layers are partially oxidized to form said oxidized layer encapsulating exposed edges of said metal layers.

22. The system of claim 14, wherein said nano-dimensional structure comprises a dot.

23. The system of claim 14, wherein said nano-dimensional structure comprises a column of material surrounded by an oxidizable material.

24. The system of claim 14, wherein said nano-dimensional structure comprises an enclosure formed in a substrate, and wherein said means for at least partially oxidizing said material cause said material to expand during oxidation to close an opening into said enclosure.

* * * * *

UNITED STATES PATENT AND TRADEMARK OFFICE
CERTIFICATE OF CORRECTION

PATENT NO. : 7,381,658 B2
APPLICATION NO. : 11/174896
DATED : June 3, 2008
INVENTOR(S) : Peter Mardilovich et al.

Page 1 of 1

It is certified that error appears in the above-identified patent and that said Letters Patent is hereby corrected as shown below:

In column 7, line 11, in Claim 2, after "consisting of" insert -- : --.

Signed and Sealed this

Eleventh Day of November, 2008

JON W. DUDAS
*Director of the United States Patent and Trademark Office*